(12) United States Patent
Kasai et al.

(10) Patent No.: US 11,774,488 B2
(45) Date of Patent: Oct. 3, 2023

(54) INSPECTION APPARATUS INCLUDING POWER SUPPLY FOR SUPPLYING POWER TO HEATING MECHANISM USED FOR HEATING DEVICE

(71) Applicant: TOKYO ELECTRON LIMITED, Tokyo (JP)

(72) Inventors: Shigeru Kasai, Yamanashi (JP); Fumiya Fujii, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 12 days.

(21) Appl. No.: 17/541,551

(22) Filed: Dec. 3, 2021

(65) Prior Publication Data

US 2022/0178988 A1 Jun. 9, 2022

(30) Foreign Application Priority Data

Dec. 9, 2020 (JP) ................. 2020-204189

(51) Int. Cl.
| | |
|---|---|
| *G01R 31/28* | (2006.01) |
| *G05D 23/19* | (2006.01) |
| *H03F 3/217* | (2006.01) |
| *H03M 3/00* | (2006.01) |
| *H05B 1/02* | (2006.01) |
| *H03K 3/017* | (2006.01) |
| *H03K 4/06* | (2006.01) |

(52) U.S. Cl.
CPC ..... *G01R 31/2849* (2013.01); *G01R 31/2831* (2013.01); *G05D 23/1902* (2013.01); *G05D 23/1913* (2013.01); *G05D 23/1917* (2013.01); *H03F 3/217* (2013.01); *H03M 3/50* (2013.01); *H05B 1/0233* (2013.01); *H03F 2200/171* (2013.01); *H03K 3/017* (2013.01); *H03K 4/06* (2013.01)

(58) Field of Classification Search
CPC ........... G05D 23/1902; G05D 23/1913; G05D 23/1917; H03F 3/2171; H03F 3/2178; H03F 3/2175; H03F 1/3211; H03F 3/211; H03F 2200/171; H03F 3/217; H03K 4/06; H03K 4/50; H03K 3/017; G01R 31/2875; G01R 31/2849; G01R 21/127; G01R 1/28; G01R 25/005; G01R 31/2831; H03M 3/50; H05B 1/0233
See application file for complete search history.

(56) References Cited

U.S. PATENT DOCUMENTS

| | | | | |
|---|---|---|---|---|
| 7,667,474 B2 * | 2/2010 | Sunohara | ........... | G01R 31/2875 324/762.01 |
| 7,768,344 B2 * | 8/2010 | Kawamoto | ............. | H03F 3/211 327/563 |

(Continued)

FOREIGN PATENT DOCUMENTS

JP 2008-066692 A 3/2008

*Primary Examiner* — Vinh P Nguyen
(74) *Attorney, Agent, or Firm* — Fenwick & West LLP (57) ABSTRACT

A power supply for supplying a power to a heating mechanism used for heating a measurement target that emits a measurement signal includes an input device configured to output an input signal that reflects a control signal in a differentiable periodic waveform having a frequency of 1 kHz or less. The power supply includes a switching amplifier configured to amplify the input signal from the input device and output the amplified signal.

17 Claims, 9 Drawing Sheets

(56) References Cited

U.S. PATENT DOCUMENTS 8,680,880 B2 * 3/2014 Kiyofuji ............ G01R 31/2875
324/754.01
8,797,055 B2 * 8/2014 Tashiro .............. G01R 31/2887
324/762.01

* cited by examiner

INSPECTION APPARATUS INCLUDING POWER SUPPLY FOR SUPPLYING POWER TO HEATING MECHANISM USED FOR HEATING DEVICE

CROSS-REFERENCE TO RELATED APPLICATIONS

This application claims priority to Japanese Patent Application No. 2020-204189 filed on Dec. 9, 2020, the entire contents of which are incorporated herein by reference.

TECHNICAL FIELD

The present disclosure relates to a power supply and an inspection apparatus.

BACKGROUND

In a semiconductor manufacturing process, a large number of electronic devices having a predetermined circuit pattern is formed on a semiconductor wafer (hereinafter, simply referred to as "wafer"). Electrical characteristics of the formed electronic devices are inspected in a wafer state by an inspection apparatus referred to as a prober.

In the case of inspecting the electrical characteristics of the devices, the inspection apparatus is configured to control a temperature of a wafer chuck holding the wafer using a coolant channel or a heater in order to reproduce a mounting environment of the electronic devices (For example, Japanese Patent Application Publication No. 2008-66692).

SUMMARY

In a measuring device such as an inspection apparatus, a power supply that supplies a power to a heater used for heating a device that emits a measurement signal requires high efficiency and reduced noise.

The present disclosure provides a power supply having high efficiency and reduced noise, and an inspection apparatus.

One aspect of the present disclosure provides a power supply for supplying a power to a heating mechanism used for heating a measurement target that emits a measurement signal, comprises an input device configured to output an input signal that reflects a control signal in a differentiable periodic waveform having a frequency of 1 kHz or less, and a switching amplifier configured to amplify the input signal from the input device and output the amplified signal.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described with reference to the accompanying drawings.

<Inspection Apparatus>

First, an inspection apparatus using a power supply according to an embodiment is used will be described.

Figure 1:
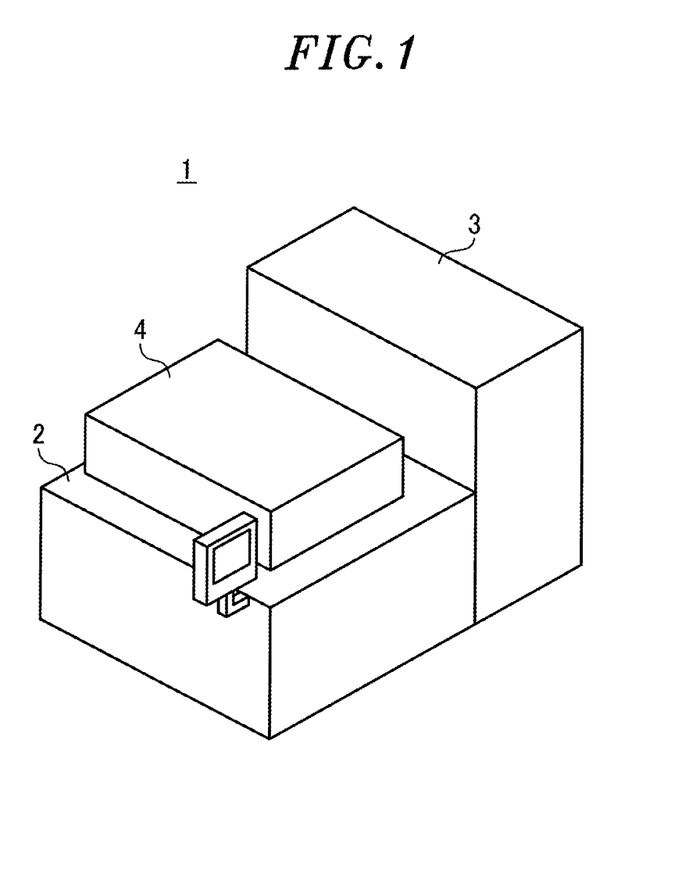
FIG. 1 is a perspective view showing a schematic configuration of an inspection apparatus using a power supply according to an embodiment.
Figure 2:
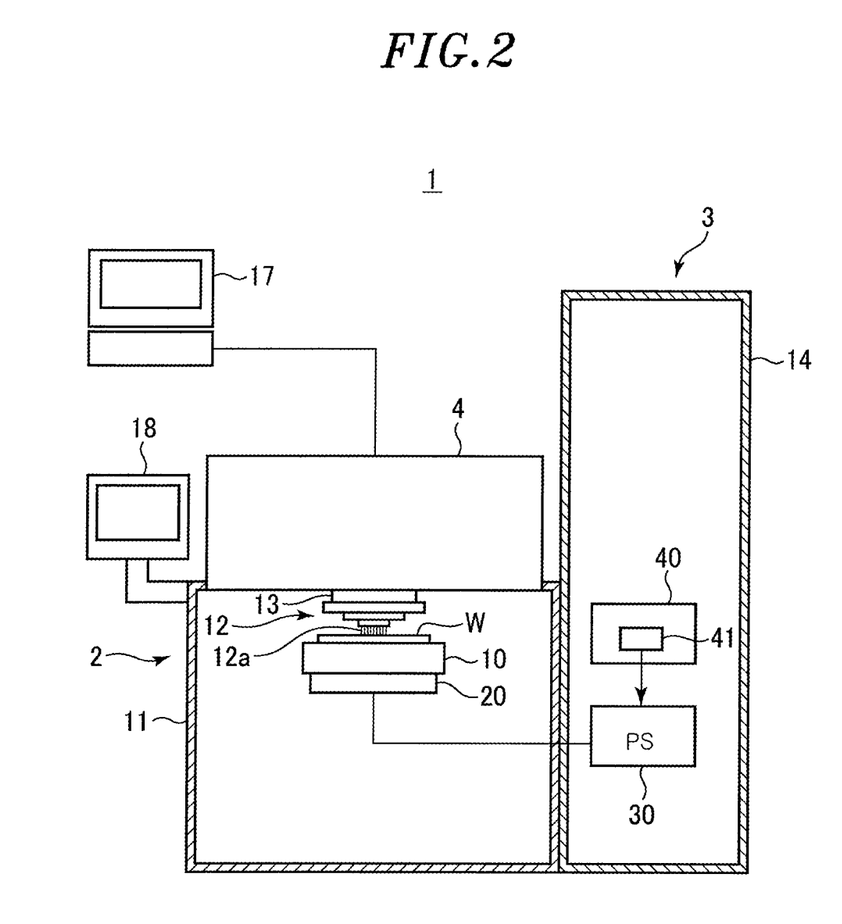
FIG. 2 is a front cross-sectional view showing a part of the inspection apparatus of FIG. 1.

FIG. 1 is a perspective view showing a schematic configuration of an inspection apparatus using a power supply according to an embodiment. FIG. 2 is a front cross-sectional view showing a part of the inspection apparatus of FIG. 1.

As shown in FIGS. 1 and 2, an inspection apparatus 1 for inspecting electrical characteristics of a plurality of devices formed on a wafer W as a substrate includes an inspection device 2, a loader 3, and a tester 4.

The inspection device 2 has a hollow housing 11, and a stage 10 on which the wafer W to be inspected is attracted and fixed is disposed in the housing 11. Further, the stage 10 is configured to be movable in a horizontal direction and a vertical direction by a moving mechanism (not shown). The stage 10 has a minimum heat capacity.

Figure 3:
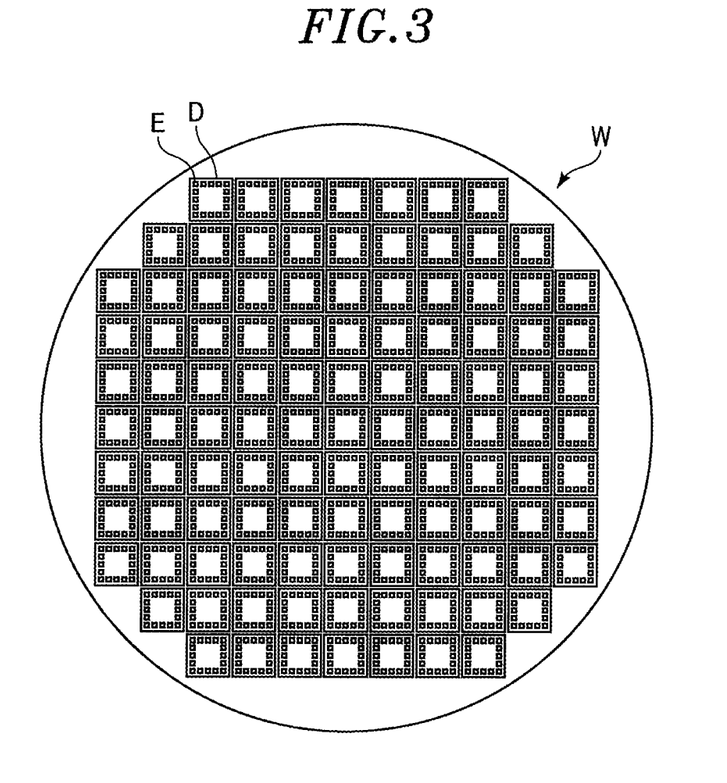
FIG. 3 is a plan view schematically showing a configuration of a wafer as a substrate to be inspected.

As shown in FIG. 3, the wafer W as a substrate to be inspected has a plurality of devices (Die) D formed at predetermined intervals by performing an etching process or a wiring process on a surface of a substantially disc-shaped silicon substrate. An electrode E is formed on a surface of the device D, and is electrically connected to a circuit element in the corresponding device D.

The stage 10 is provided with a temperature sensor (not shown) for measuring a temperature of the wafer W. Further, when a temperature measuring circuit is incorporated in the device D formed on the wafer W, a temperature of the device D may be measured by the temperature measuring circuit.

A heating mechanism (heater) 20 for heating the wafer W via the stage 10 is disposed below the stage 10. The heating mechanism (heater) 20 may be disposed in the stage 10. The heating mechanism (heater) 20 is not particularly limited, and various devices such as a resistance heater, a lamp, an LED, and the like may be used. The stage 10 may be provided with a coolant channel (not shown) for circulating a coolant such as cooling water or the like.

A probe card 12 is disposed above the stage 10 in the inspection device 2 to face the stage 10. The probe card 12 has a plurality of probes 12a that are contactors. Further, the probe card 12 is connected to a tester 4 through an interface 13. When the probes 12a are in contact with electrodes of the devices D of the wafer W, the probes 12a supply a power from the tester 4 to the devices D through the interface 13, or transmit a measurement signal from the devices D to the tester 4 through the interface 13.

The loader 3 has a housing 14, and a FOUP (not shown) as a transfer container accommodating wafers W is disposed in the housing 14. Further, the loader 3 has a transfer device (not shown), and the wafer W accommodated in the FOUP is taken out and transferred to the stage 10 of the inspection device 2 by the transfer device. Further, the wafer W on the stage 10, whose electrical characteristics have been inspected, is transferred and accommodated in the FOUP by the transfer device.

A power supply (PS) 30 for supplying a power to the heating mechanism (heater) 20 and a controller 40 are disposed in the housing 14 of the loader 3. A control signal is inputted to the power supply 30 from the controller 40, and the power supply 30 supplies a power to the heating mechanism (heater) 20 based on the control signal.

The tester 4 has a test board (not shown) that reproduces a part of a circuit configuration of a motherboard on which the electronic devices are mounted. The test board is connected to a tester computer 17 that detects a measurement signal emitted from the device D to be inspected formed on the wafer W and determines whether or not the devices D are defective or non-defective. In the tester 4, circuit configurations of various types of motherboards can be reproduced by replacing the test board. In order to perform high-precision inspection, the measurement signal from the device D requires minimum noise, particularly minimum RF noise.

The probe card 12, the interface 13, and the tester 4 constitute an inspection mechanism.

In the case of inspecting the electrical characteristics of the devices D, the tester computer 17 transmits data to the test board connected to the electronic devices through the probes 12a. Then, the tester computer 17 determines whether or not the transmitted data has been correctly processed by the test board based on the electric signals from the test board. At this time, by applying a voltage to the electrodes E, a current can flow through the circuit elements in the devices D.

The controller 40 includes a computer and has a temperature controller 41. The temperature controller 41 sends a temperature control signal to the power supply 30 based on a set temperature and a temperature signal from a temperature sensor or a temperature measurement circuit.

The controller 40 has, in addition to the temperature controller 41, a main controller having a plurality of control function devices for controlling individual components of the inspection apparatus 1, and the main controller controls operations of the individual components of the inspection apparatus. Further, the controller 40 has an input device, an output device, a display device, and a storage device. The main controller controls the individual components based on a processing recipe that is a control program stored in a storage medium (a hard disk, an optical disk, a semiconductor memory, or the like) built in the storage device.

The power supply 30 and the controller 40 may be disposed in the housing 11 of the inspection device 2.

The housing 11 of the inspection device 2 is provided with a user interface 18 forming a part of the controller 40. The user interface 18 for displaying information for a user or for allowing a user to input a command includes, e.g., an input device such as a touch panel, a keyboard, or the like and a display device such as a liquid crystal display or the like.

<Power Supply>

Next, the configuration of the power supply 30 will be described.

The inspection apparatus 1 of the present embodiment inspects (tests) the devices (Die) D formed on the wafer W. Therefore, it is necessary to perform control for minimizing the noise of the measurement signal from the devices D during the inspection. On the other hand, the devices D require a high power density, and it is necessary to perform high-precision temperature control at a high speed. Conventionally, since the heat emission amount of the devices D is relatively small, a temperature is controlled by ensuring thermal uniformity by using a material such as Cu or Al having a high thermal conductivity for the stage 10 and increasing a thickness of the stage 10. However, recently, the heat emission amount of the devices D is increasing, and it is difficult to ensure sufficient temperature controllability due to an excessive heat emission amount of the stage. Therefore, the present embodiment is intended to improve the controllability by minimizing the heat capacity of the stage 10 and shortening a control cycle.

A linear amplifier that does not involve switching may be used as the power supply 30 of the heating mechanism (heater) 20 capable of realizing the above-described temperature control. A class B amplifier having high efficiency among the linear amplifiers has a maximum efficiency of 75%. On the other hand, a non-linear amplifier such as a switching amplifier is efficient but has a lot of noise, so that the accuracy of the measurement signals from the devices D may be low.

From the above, in the present embodiment, the power supply 30 has an input device for outputting an input signal that reflects a control signal U(t) in a divisible periodic waveform having a frequency of 1 kHz or less, and a switching amplifier that amplifies the signal from the input device in a switching circuit and outputs the amplified signal.

With such a configuration, the power supply having high efficiency and reduced noise can be obtained while maintaining excellent control characteristics. At this time, the control signal is changed at the point where the voltage is zero. Further, the control signal is outputted as an operation amount (%).

The differentiable periodic waveform indicates a repeatedly differentiable waveform such as a sine wave, a cos wave, and a composite wave thereof. Radiation noise can be reduced by setting the frequency to 1 kHz or less using the differentiable periodic waveform. According to Ampere's law, the relationship rotH=i+(∂D/∂t) (H: magnetic field, i: conduction current, ∂D/∂t: displacement current, and D: magnetic flux density) is satisfied, and the radiation noise increases as ∂D/∂t increases. Since the waveform and the frequency are important in reducing ∂D/∂t, the waveform is set to a differentiable periodic waveform without sudden changes in the current, and the frequency is set to a relatively low value of 1 kHz or less to reduce the radiation noise.

In the case of using a switching amplifier as an amplifier, a higher efficiency can be obtained compared to the case of using a linear amplifier. In other words, since the switching amplifier functions as a switch that allows a current to flow to a load, the power wasted by an output transistor is minimized, which results in a high efficiency. In order to improve the efficiency, it is important that the point where the voltage is maximum and the point where the current is maximum are shifted in terms of time. In other words, an imaginary part of a load impedance seen from the output transistor side of the switching amplifier becomes zero. In general, an inductance component and a capacitance component corresponding to the imaginary part change depending on the frequency, so that it is necessary to specify one frequency.

By providing a series resonant circuit that resonates at the frequency of the input signal, e.g., 100 Hz, on the rear side of the switching amplifier, the voltage and current are in phase, and theoretically, only the resistance component of the resonant circuit remains. Therefore, a total impedance is combination of the resistance component of the resonant circuit and the resistance impedance of the load. Further, noise other than 100 Hz is removed by the series resonant circuit, and a lower noise signal can be realized.

Further, in order to remove high frequency noise that affects the inspection, it is preferable to provide a low pass filter using an inductance and a capacitance on the rear side of the switching amplifier. The low pass filter has almost no resistance up to its cutoff frequency, and attenuation occurs at a frequency higher than the cutoff frequency. Therefore, a harmonic component is reflected and thus are not transmitted to the load. In other words, the high frequency noise can be removed, and the lower noise signal can be realized.

In order to remove noise and improve an inspection accuracy of the inspection apparatus 1, it is preferable to use a series resonant circuit capable of removing not only noise on a high frequency side but also noise on a low frequency side. By using both the low pass filter and the series resonance circuit, the noise removal effect can be further enhanced.

The input device may have a configuration including a signal source that generates a signal having a differentiable periodic waveform with a frequency of 1 kHz or less, and a multiplier that multiplies the control signal U(t) from the temperature controller 41 of the controller 40 and the signal from the signal source.

The switching amplifier may be an analog amplifier using pulse width modulation (PWM) or the like, or a digital amplifier using ΔΣ conversion (ΔΣ modulation) or the like. In the case of the analog amplifier, a low pass filter is used as a smoothing circuit on a rear side of the output transistor. The low pass filter also functions as a noise removal circuit that removes harmonic noise. In the case of the digital amplifier using ΔΣa conversion, the ΔΣ conversion has a noise shaping function and, thus, noise can be moved to a high frequency. Therefore, the low pass filter or the series resonance circuit can be provided to enhance the noise removal effect.

(First Example of Power Supply)

Next, a first example of the power supply 30 will be described.

Here, an example in which an analog amplifier is used as a switching amplifier will be described.

Figure 4:
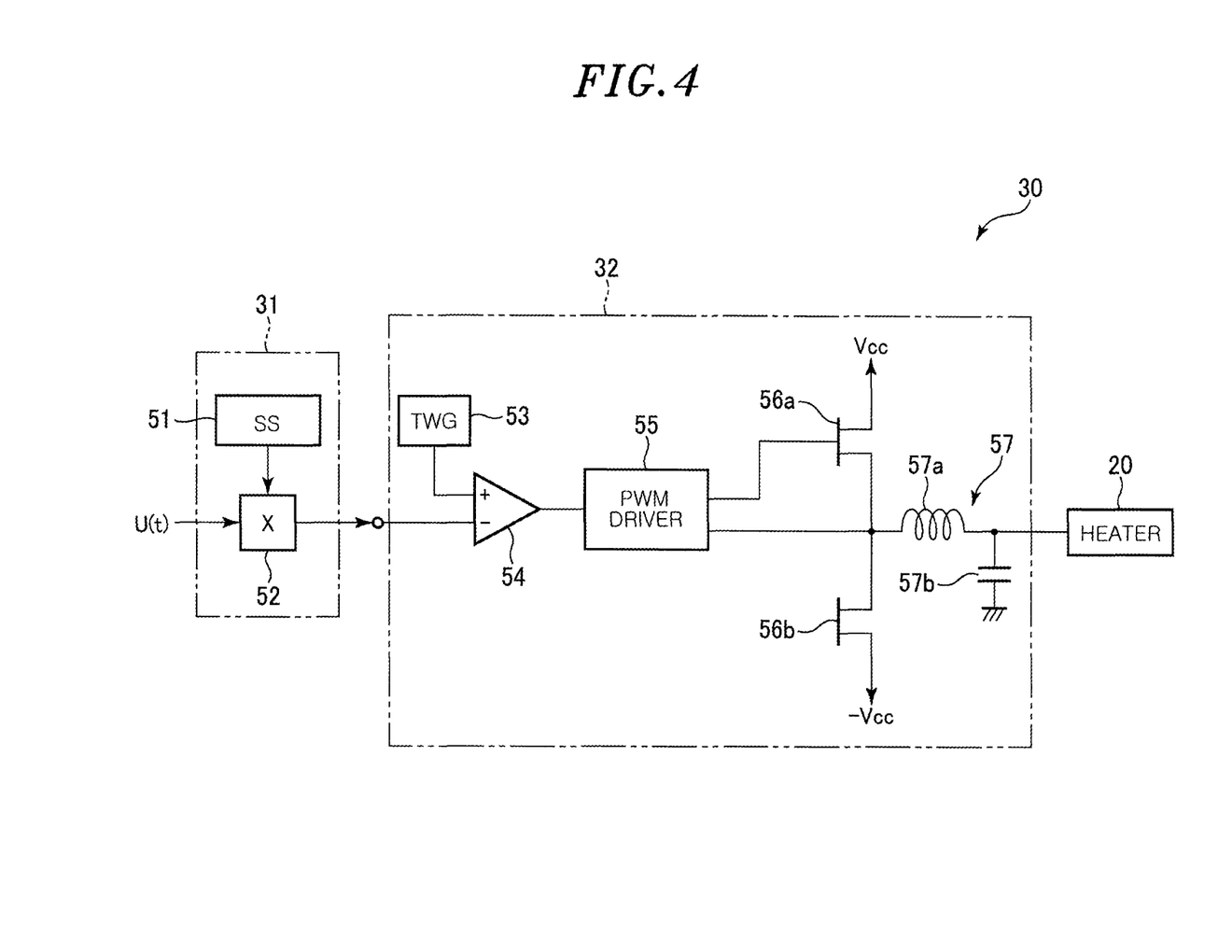
FIG. 4 is a block diagram showing a first example of a power supply.

FIG. 4 is a block diagram showing the first example of the power supply 30. In this example, the power supply 30 has an input device 31 and a switching amplifier 32.

The input device 31 includes a signal source (SS) 51 for emitting a differential periodic waveform having a specific frequency of 1 kHz or less, e.g., a sine wave, and a multiplier 52 for multiplying the control signal U(t) from the controller 40 and the waveform of the signal source 51. The input device 31 outputs a periodic waveform having a wave height corresponding to an operation amount to the switching amplifier 32. The control signal is outputted as an operation amount (%) from the controller 40.

The switching amplifier 32 is configured as an analog amplifier using PWM, i.e., a PWM amplifier. The switching amplifier 32 includes a triangular wave generator (TWG) 53, a comparator 54, a PWM driver 55, output transistors 56*a* and 56*b*, and a low pass filter 57.

The input signal from the input device 31 and the triangular wave generated by the triangular wave generator 53 are inputted to the comparator 54. The comparator 54 compares these signals and outputs signals "1" and "0" depending on the magnitudes of these signals. These signals are transmitted to the PWM driver 55 and a desired duty ratio thereof is set, so that a desired square wave is outputted through the output transistors 56*a* and 56*b*. The square wave is restored to, e.g., a sine wave having a differentiable waveform similar to the input waveform by the low pass filter 57 that is a smoothing circuit, and is supplied to the heating mechanism (heater) 20. The low pass filter 57 has a coil 57*a* and a capacitor 57*b*. Although it is illustrated that the output transistors 56*a* and 56*b* have the same structure for convenience, they actually have different conductive types. The output transistors 56*a* and 56*b* may have the same conductive type. In that case, one of them is provided with a reversing device.

In the case of using a switching amplifier as an amplifier, it is possible to improve the efficiency and reduce the radiation noise by setting a frequency to 1 kHz or less using a differentiable periodic waveform.

(Second Example of Power Supply)

Next, a second example of the power supply 30 will be described.

Figure 5:
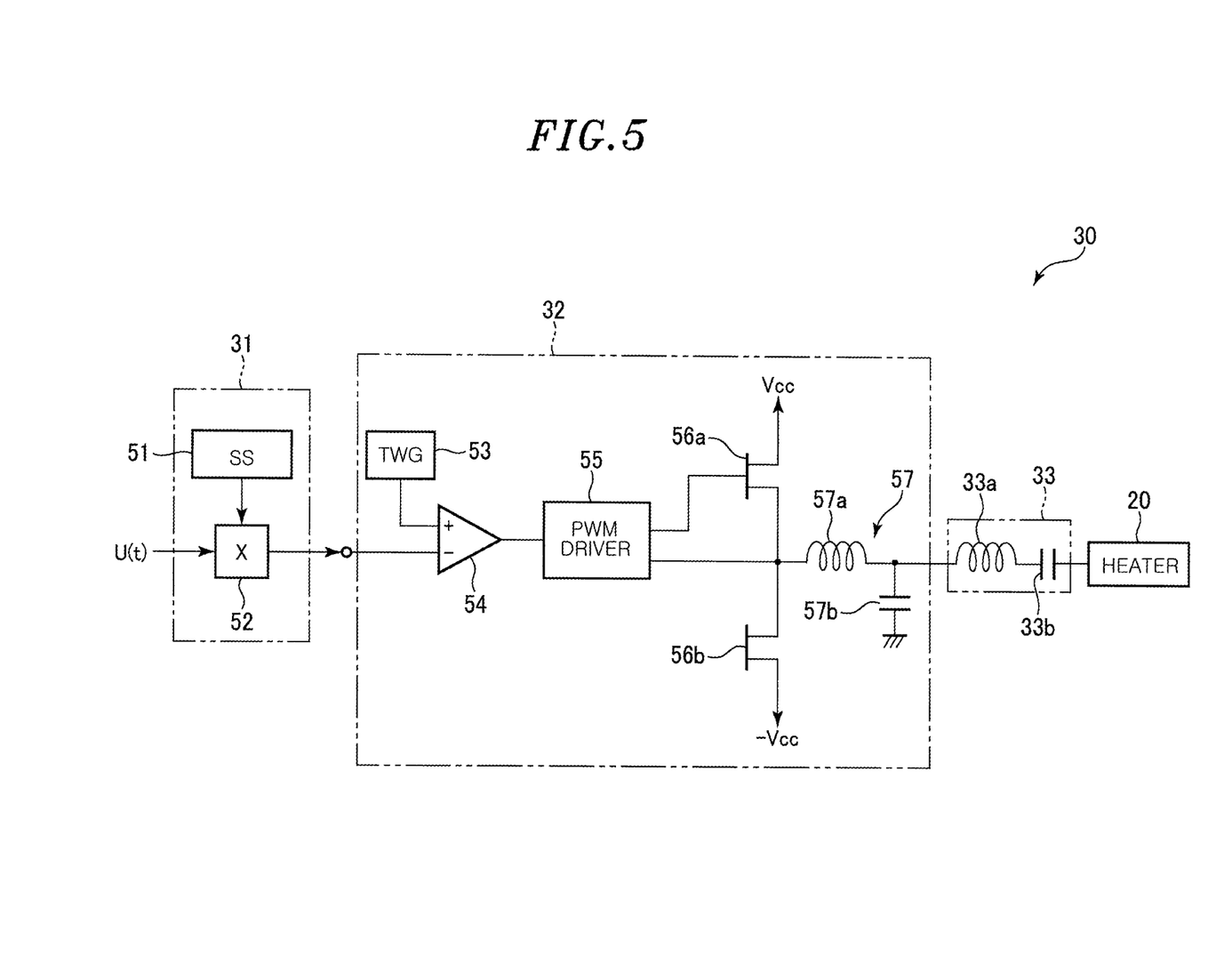
FIG. 5 is a block diagram showing a second example of the power supply.

FIG. 5 is a block diagram showing a second example of the power supply 30.

The second example is different from the first example only in that a series resonance circuit 33 that resonates at the frequency of the input signal is disposed on the rear side of the switching amplifier 32. In the series resonance circuit 33, the coil 33*a* and the capacitor 33*b* are connected in series. As described above, by providing the series resonant circuit 33, the voltage and the current are in phase, and theoretically, only the resistance component of the resonant circuit remains. Further, noise other than the frequency of the input signal is removed.

(Third Example of Power Supply)

Next, a third example of the power supply 30 will be described.

Figure 6:
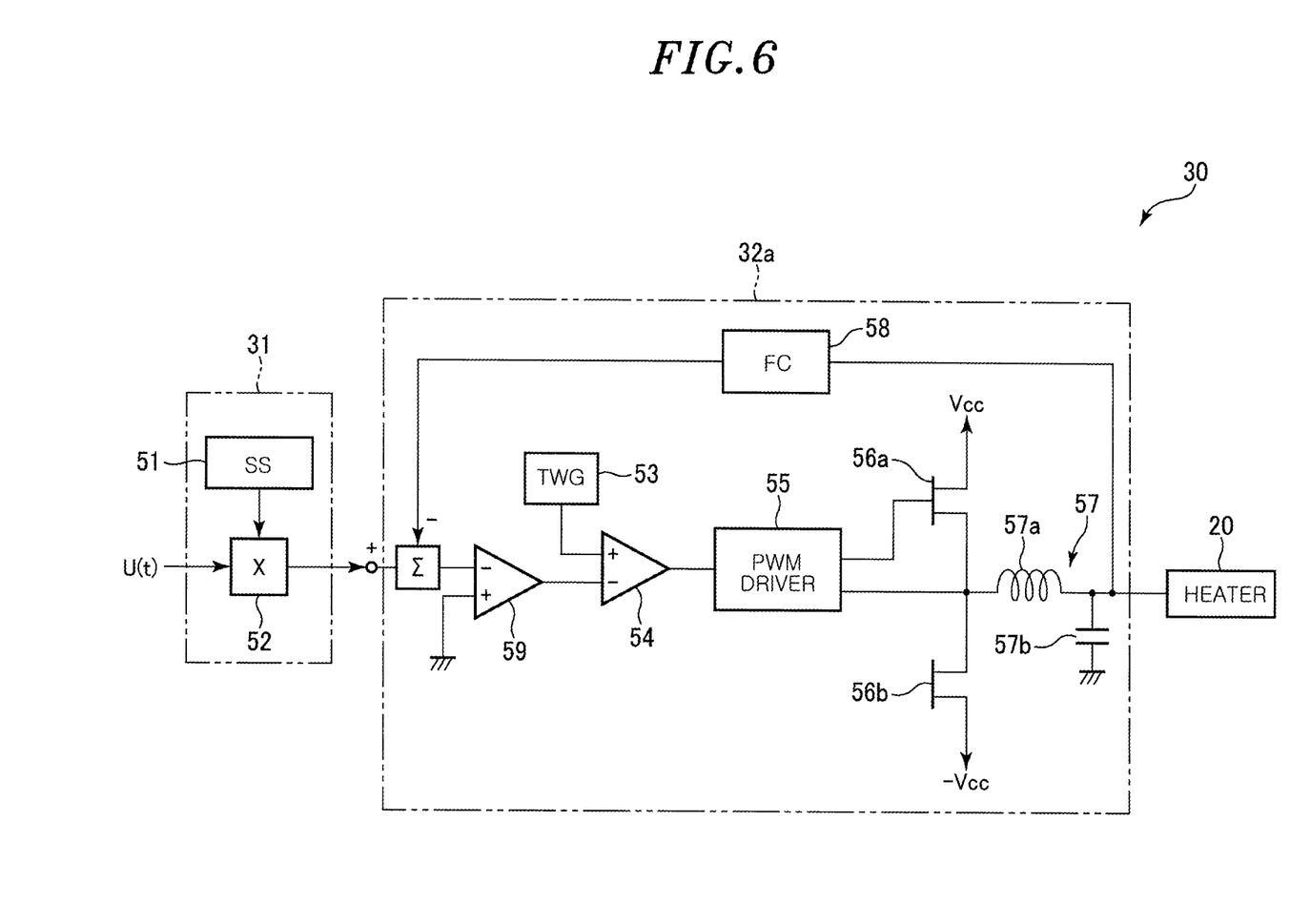
FIG. 6 is a block diagram showing a third example of the power supply.

FIG. 6 is a block diagram showing the third example of the power supply 30.

The third example is different from the first example only in that a switching amplifier 32*a* having a configuration in which a feedback network (feedback circuit, FC) 58 and an error amplifier 59 are further added to the switching amplifier 32 of the first example is used. In this configuration, an output signal is fed back by the feedback network 58, a difference between the input signal and the output signal is amplified by the error amplifier 59 and inputted to the comparator 54. With this configuration, a higher speed can be obtained. The series resonant circuit 33 may be added to the configuration of FIG. 6.

(Fourth Example of Power Supply)

Next, a fourth example of the power supply 30 will be described.

Figure 7:
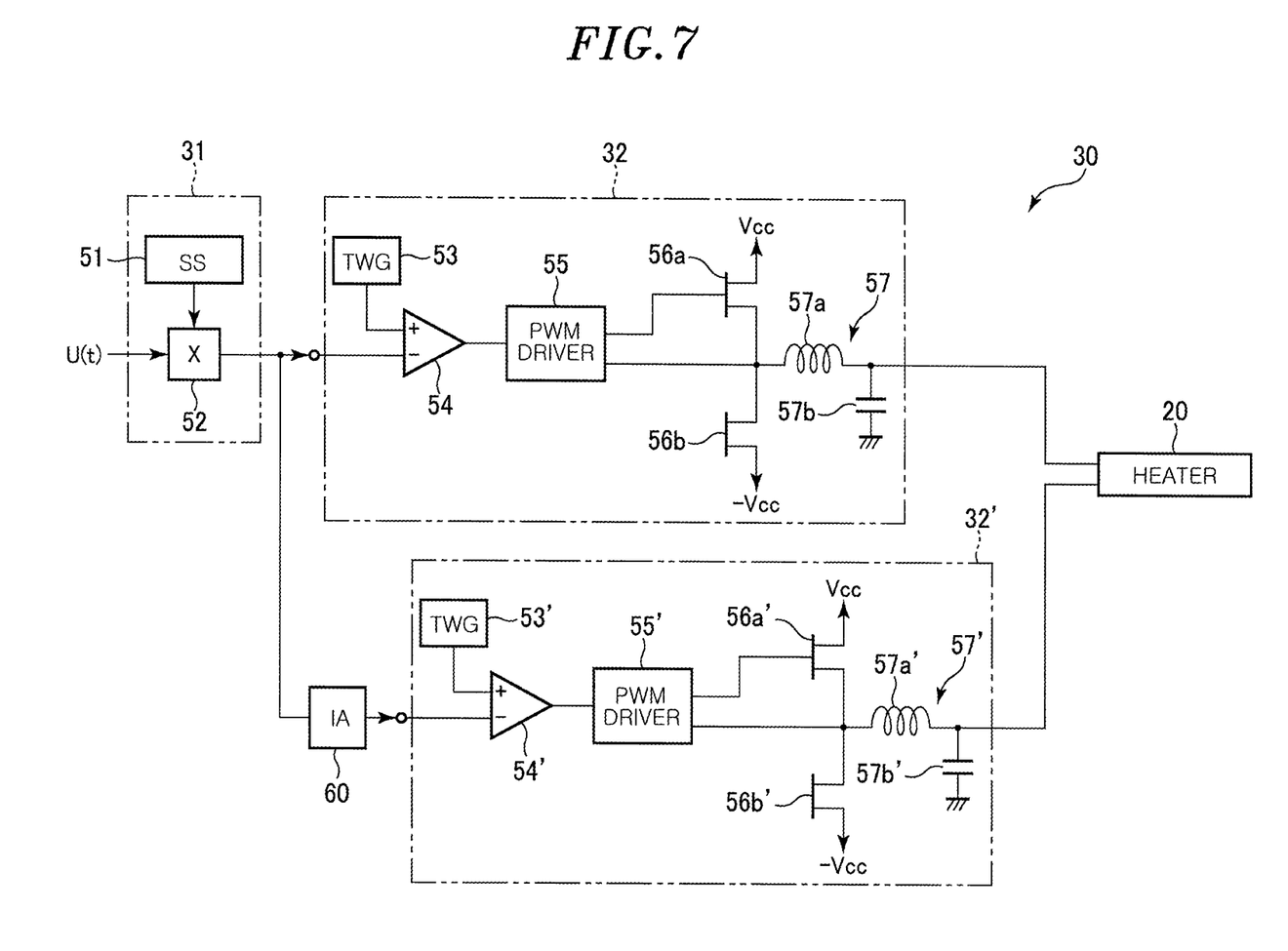
FIG. 7 is a block diagram showing a fourth example of the power supply.

FIG. 7 is a block diagram showing the fourth example of the power supply 30.

In this example, the power supply 30 includes an input device 31, a switching amplifier 32 similar to that in the first example, and another switching amplifier 32'. The switching amplifier 32' has the same structure as that of the switching amplifier 32. In other words, the switching amplifier 32' has a triangular wave generator 53', a comparator 54', a PWM driver 55', output transistors 56*a*' and 56*b*', and a low pass filter 57' (a coil 57*a*' and a capacitor 57*b*'). The input signal from the input device 31 is directly inputted to one switching amplifier 32, and is inputted to the other switching amplifier 32' through an inverting amplifier (IA) 60. Then, the outputs of the two switching amplifiers 32 and 32' are supplied to the heating mechanism (heater) 20. Accordingly, the power is doubled.

Also in the example of FIG. 7, the series resonance circuit may be disposed on the output side, and two switching amplifiers may include a feedback network and an error amplifier.

In the first to fourth examples, the PWM amplifier is used as the analog amplifier. However, another amplifier such as an amplifier using pulse frequency modulation (PFM) or the like may be used.

(Fifth Example of Power Supply)

Next, a fifth example of the power supply 30 will be described.

Here, an example in which a digital amplifier is used as the switching amplifier will be described.

Figure 8:
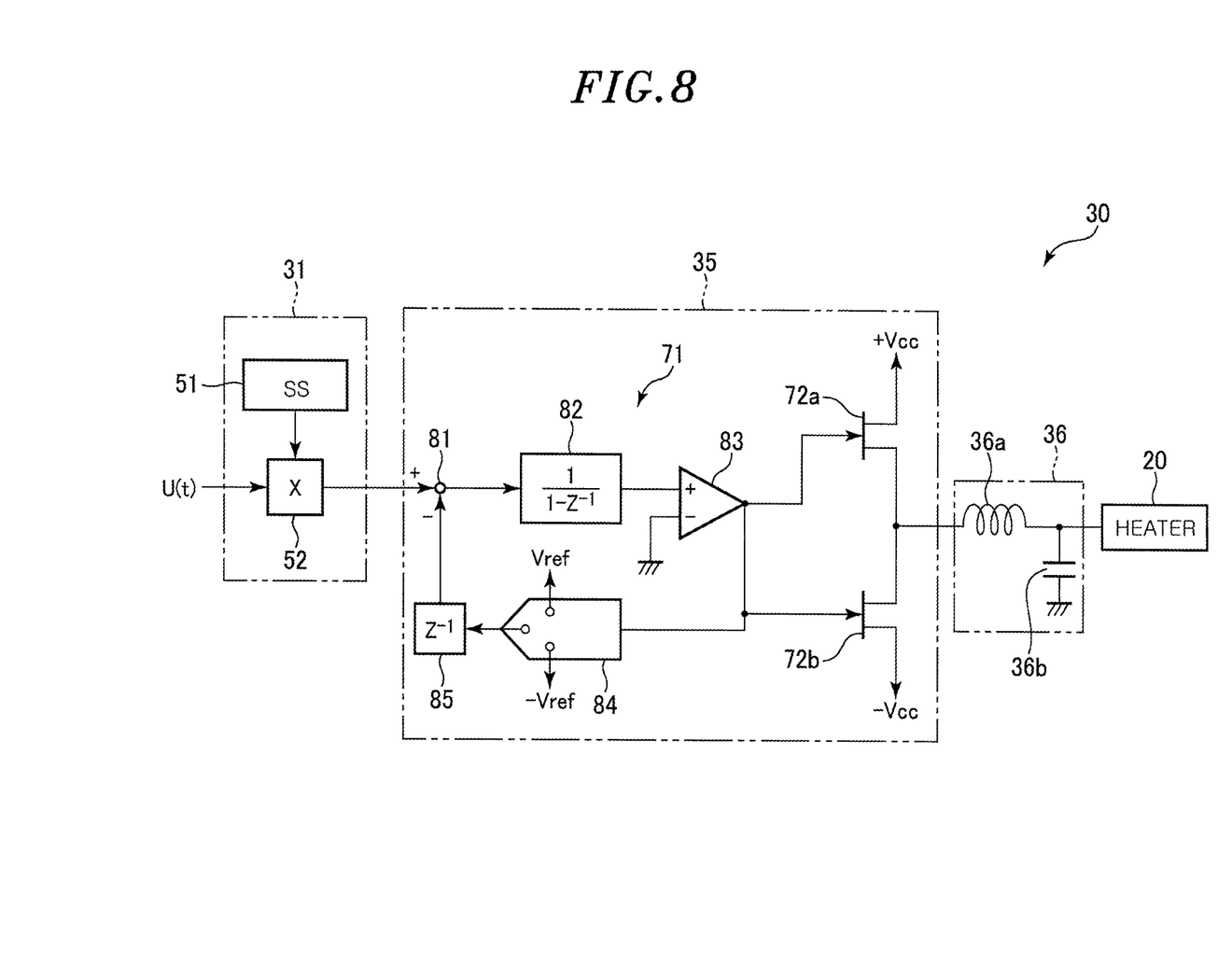
FIG. 8 is a block diagram showing a fifth example of the power supply.

FIG. 8 is a block diagram showing the fifth example of the power supply 30. In this example, the power supply 30 has an input device 31, a switching amplifier 35, and a low pass filter 36.

The input device 31 includes a signal source 51 that emits a differential periodic waveform having a specific frequency of 1 kHz or less, e.g., a sine wave, similar to that in the first example, and a multiplier 52 that multiplies the waveform of the control signal U(t) from the controller 40 and the waveform of the signal source 51. The input device 31 inputs a periodic waveform having a wave height corresponding to an operation amount to the switching amplifier 35.

The switching amplifier 35 includes a ΔΣ conversion (ΔΣ modulation) circuit 71 and output transistors 72*a* and 72*b*. The ΔΣ conversion (ΔΣ modulation) circuit 71 includes a differentiator 81, an integrator 82, a comparator 83, a 1-bit DA converter 84, and a shifter 85.

The differentiator 81 obtains the difference between the input signal and the feedback signal from the 1-bit DA converter 84 via the shifter 85. The integrator 82 integrates the signal from the differentiator 81. The comparator 83 compares the integrated signal with the reference value and outputs a pulse train of "1" and "0" depending on the magnitudes thereof. The signals "1" and "0" from the comparator 83 are amplified by the output transistors 72*a* and 72*b* to correspond to "1" and "0", respectively, and become digital signals corresponding to the input signals. Also, the signal of the comparator 83 is sent as a feedback signal to the 1-bit DA converter 84. The 1-bit DA converter 84 generates a voltage equal to a positive reference voltage or a negative reference voltage depending on the output of the comparator 83. When the output of the comparator 83 is "1", the reference voltage component is subtracted from the analog input signal. When the output is "0", the reference voltage is added to the analog input signal. The shifter 85 shifts the phase of the analog signal from the 1-bit DA converter 84.

Although it is illustrated that the output transistors 72*a* and 72*b* have the same structure for convenience similarly to the output transistors 56*a* and 56*b* of the first example, they actually have different conductive types. The output transistors 72*a* and 72*b* may have the same conductive type. In that case, one of them is provided with a reversing device.

The low pass filter 36 has a coil 36*a* and a capacitor 36*b*, and is disposed on the rear side of the switching amplifier 35 to remove noise of a signal from the switching amplifier 35.

As described above, in this example, by returning the output signal of the comparator 83 as the input signal via the 1-bit DA converter 84, the modulation is performed such that an quantization error (noise) generated in the comparator 83 is reduced in the low frequency range and increased in the high frequency range. In other words, noise shaping can be performed to increase noise in the high frequency range. The signal subjected to the noise shaping can be easily removed by the low pass filter 36, and a lower noise signal can be realized.

(Sixth Example of Power Supply)

Next, a sixth example of the power supply 30 will be described.

Figure 9:
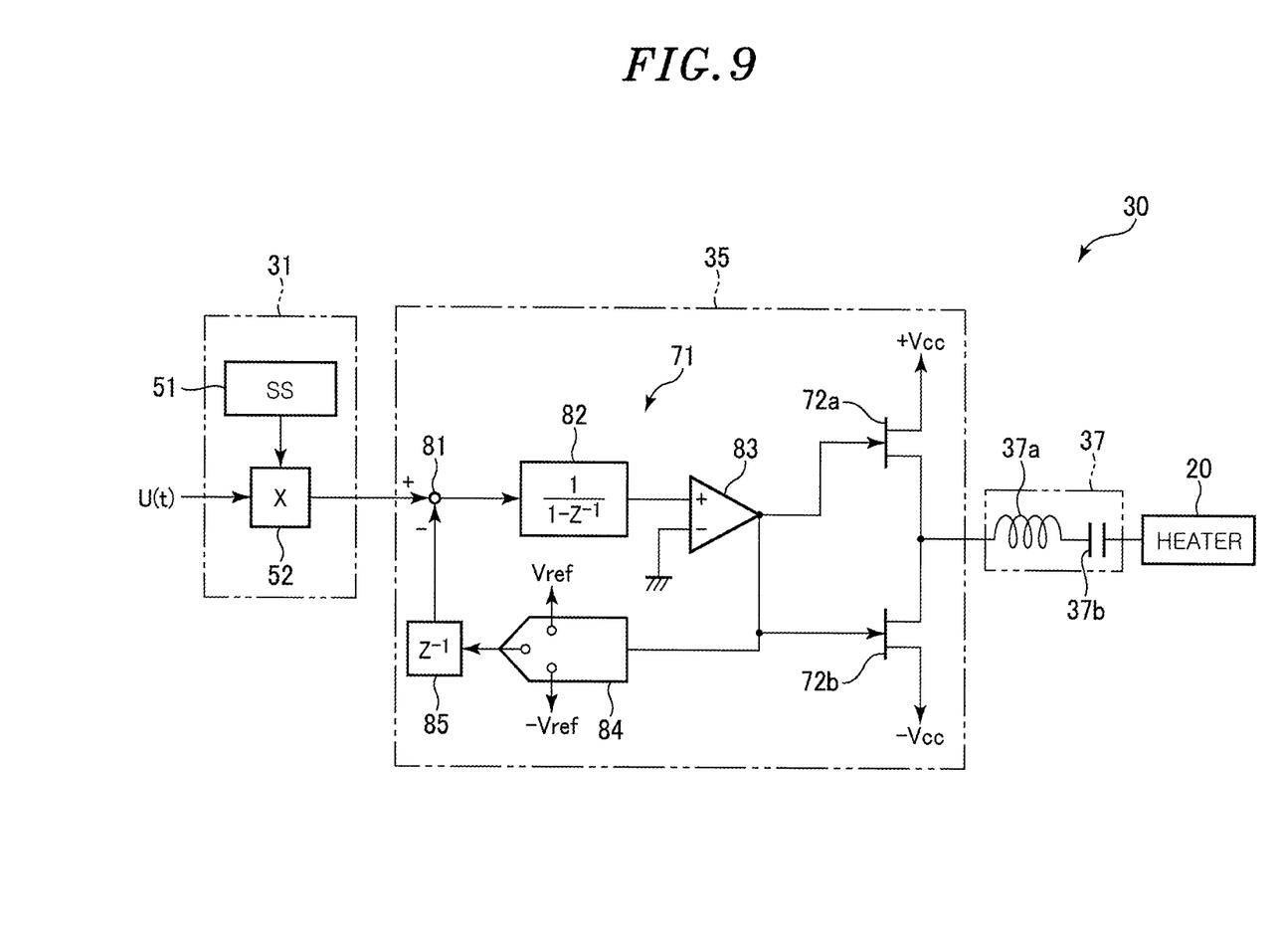
FIG. 9 is a block diagram showing a sixth example of the power supply.

FIG. 9 is a block diagram showing the sixth example of the power supply 30.

In this example, the low pass filter 36 of FIG. 8 is replaced with a series resonance circuit 37 that resonates at the frequency of the input signal. In the series resonance circuit 37, the coil 37*a* and the capacitor 37*b* are connected in series. By providing the series resonance circuit 37, noise other than the frequency of the input signal is removed. Accordingly, not only high frequency noise but also low frequency noise is removed, which makes it possible to supply a more accurate signal to the heating mechanism (heater) 20.

Both the low pass filter 36 and the series resonance circuit 37 may be provided. In this case, it is preferable to provide a series resonance circuit 37 at the rear end of the low pass filter 36.

In the fifth and sixth examples, the ΔΣ conversion (ΔΣ modulation) circuit is used as a digital amplifier. However, another amplifier in which PWM, PFM, or the like is realized by software may be used.

<Inspection Process Performed by Inspection Apparatus>

Next, an example of an inspection process performed on the wafer W by the inspection apparatus 1 will be described.

First, the wafer W is taken out from the FOUP of the loader 3, transferred to the stage 10, and placed on the stage 10 by the transfer device.

In this state, the stage 10 is moved to bring the probes 12*a* disposed above the stage 10 into contact with the electrodes E of the devices D to be inspected on the wafer W, and inspection signals are inputted to the probes 12*a* to start the inspection of the devices D formed on the wafer W.

At this time, the heating mechanism (heater) 20 heats the devices (Die) D formed on the wafer W via the stage 10 to a desired temperature. At this time, the temperature information from the temperature sensor or the temperature measurement circuit incorporated in the device D is fed back to the temperature controller 41 of the controller 40, and the control signal is sent from the temperature controller 41 to the power supply 30 based on a temperature set value set in the temperature controller 41 and the feedback temperature information. A desired power is supplied from the power source 30 to the heating mechanism (heater) 20 based on the control signal, thereby controlling the devices D formed on the wafer W to a desired temperature. At this time, the temperature may be controlled by the coolant flowing from the coolant channel (not shown) to the stage 10.

As described above, recently, the heat emission amount of the devices is increasing. Therefore, the present embodiment is intended to improve the controllability of the temperatures of the devices D by minimizing the heat capacity of the stage 10 and shortening the control cycle. In order to realize such temperature control with high efficiency and reduced noise, in the present embodiment, as described above, the power supply 30 includes the input device for inputting an input signal that reflects the control signal U(t) in a differentiable periodic waveform having a frequency of 1 kHz or less, and the switching amplifier for amplifying the signal inputted from the input device in the switching circuit and outputting the amplified signal.

As described above, the power supply 30 configured as described above uses a differentiable periodic waveform having a frequency of 1 kHz or less, so that the radiation noise is reduced. Further, since a switching amplifier is used as an amplifier, the efficiency can be improved compared to the case of using a linear amplifier. Therefore, the adverse effect of noise during inspection is reduced, and an inspection cost can be reduced.

A plurality of electronic devices may be inspected at once or all of the electronic devices may be inspected at once as in batch contact probing employed in DRAM or the like.

<Other Applications>

As described above, the embodiments of the present disclosure are illustrative in all respects and are not restrictive. The above-described embodiments may be omitted, replaced, or changed in various forms without departing from the scope of the appended claims and the gist thereof.

For example, in the above-described embodiment, the power supply supplies a power to the heating mechanism used for heating a device to be inspected in the case of inspecting electrical characteristics of the devices formed on the wafer has been described. However, the present disclosure is not limited thereto, and any power supply that supplies a power to the heating mechanism used for heating a measurement target from which a measurement signal is detected may be used. For example, a handler power supply may be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus for inspecting a device to be inspected by detecting a measurement signal emitted from the device, the inspection apparatus comprising:
   a heating mechanism used for heating the device;
   a power supply for supplying a power to the heating mechanism based on a control signal provided by a controller,
   wherein the power supply includes:
   an input device configured to output an input signal that reflects the control signal in a differentiable periodic waveform having a frequency of 1 kHz or less; and
   a switching amplifier configured to amplify the input signal from the input device and output an amplified signal.

2. The inspection apparatus of claim 1, wherein the input device includes:
   a signal source configured to generate a signal having the differentiable periodic waveform having a frequency of 1 kHz or less; and
   a multiplier configured to multiply the control signal and the signal generated by the signal source.

3. The inspection apparatus of claim 1, wherein the control signal is changed at a point where a voltage is zero.

4. The inspection apparatus of claim 1, wherein a point where a voltage of a signal passing through the switching amplifier is maximum and a point where a current of the signal passing through the switching amplifier is maximum are shifted in terms of time.

5. The inspection apparatus of claim 1, wherein the switching amplifier has an analog amplifier.

6. The inspection apparatus of claim 5, wherein the analog amplifier is an analog amplifier using PWM.

7. The inspection apparatus of claim 6, wherein the analog amplifier using PWM includes:
   a triangular wave generator;
   a comparator configured to compare the input signal with a triangular wave generated by the triangular wave generator;
   a PWM driver configured to set a duty ratio of a signal outputted from the comparator;
   an output transistor configured to output a signal from the PWM driver in the form of a desired square wave; and
   a low pass filter configured to smooth the square wave to obtain the differentiable waveform similar to a waveform of the input signal.

8. The inspection apparatus of claim 7, wherein the analog amplifier using the PWM further includes:
   a feedback circuit configured to feedback an output signal; and
   an error amplifier configured to amplify a difference between the feedback output signal and the input signal and input the difference in the comparator.

9. The inspection apparatus of claim 6, wherein the power supply further comprises:
   another switching amplifier having the same configuration as the configuration of the switching amplifier,
   wherein the input signal is directly inputted to the switching amplifier, and the input signal is inputted to the another switching amplifier via an inverting amplifier, and
   wherein outputs of the switching amplifier and the another switching amplifier are outputted to the heating mechanism.

10. The inspection apparatus of claim 5, further comprising:
    a series resonance circuit disposed on a downstream side of the switching amplifier and resonates at the frequency of the input signal.

11. The inspection apparatus of claim 1, wherein the switching amplifier has a digital amplifier.

12. The inspection apparatus of claim 11, wherein the digital amplifier is a digital amplifier using $\Delta\Sigma$ conversion.

13. The inspection apparatus of claim 12, wherein the switching amplifier includes a $\Delta\Sigma$ conversion circuit and an output transistor of which gate is connected to an output terminal of the $\Delta\Sigma$ conversion circuit.

14. The inspection apparatus of claim 13, wherein the $\Delta\Sigma$ conversion circuit includes:
    a differentiator configured to obtain a difference between the input signal from the input device and a feedback signal;
    an integrator configured to integrate a signal from the differentiator, and
    a comparator configured to compare the integrated signal with a reference value and output a pulse train of "1" and "0" depending on magnitudes of a compared result to the output transistor; and
    a 1-bit DA converter configured to generate a voltage equal to a positive reference voltage or a negative reference voltage depending on an output from the comparator and output the voltage in the form of the feedback signal to the differentiator.

15. The inspection apparatus of claim 11, wherein the power supply further comprises:
    a low pass filter disposed on a downstream side of the switching amplifier.

16. The inspection apparatus of claim 11, wherein the power supply further comprises:
   a series resonance circuit disposed on a downstream side of the switching amplifier and configured to resonate at the frequency of the input signal.

17. An inspection apparatus comprising:
   a stage on which a wafer is placed, wherein a plurality of devices is formed on the wafer;
   an inspection mechanism configured to inspect the devices formed on the wafer placed on the stage by bringing probes into electrical contact with the devices;
   a heating mechanism configured to heat the wafer placed on the stage;
   a power supply configured to supply a power to the heating mechanism; and
   a controller configured to send a control signal to the power supply, wherein the power supply includes:
   an input device configured to output an input signal that reflects the control signal in a differentiable periodic waveform having a frequency of 1 kHz or less; and
   a switching amplifier configured to amplify the input signal from the input device and output an amplified signal.

* * * * *